US005962188A

United States Patent [19]

DeBoer et al.

[11] Patent Number: 5,962,188

[45] Date of Patent: Oct. 5, 1999

[54] DIRECT WRITE LITHOGRAPHIC PRINTING PLATES

[75] Inventors: Charles D. DeBoer, Palmyra; Judith L. Fleissig, Rochester, both of N.Y.

[73] Assignee: Kodak Polychrome Graphics LLC, Norwalk, Conn.

[21] Appl. No.: 08/881,163

[22] Filed: Jun. 24, 1997

[51] Int. Cl.[6] .............................. G03F 7/075; G03F 7/095

[52] U.S. Cl. .................................... 430/273.1; 430/275.1; 430/278.1; 430/279.1; 430/272.1

[58] Field of Search .................................... 101/467, 457, 101/462; 430/272.1, 273.1, 275.1, 278.1, 279.1

[56] References Cited

U.S. PATENT DOCUMENTS

| | | | |
|---|---|---|---|
| 2,244,325 | 6/1941 | Bird | 252/313 |
| 2,574,902 | 11/1951 | Bechtold et al. | 252/313 |
| 2,597,872 | 5/1952 | Iler et al. | 260/29.6 |
| 3,476,937 | 11/1969 | Vrancken | 250/315.3 |
| 3,832,948 | 9/1974 | Barker | 101/401.1 |
| 3,964,389 | 6/1976 | Peterson | 101/467 |
| 3,964,906 | 6/1976 | Kenney | 96/33 |
| 4,034,183 | 7/1977 | Uhlig | 219/122 |
| 4,054,094 | 10/1977 | Caddell et al. | 101/467 |
| 4,081,572 | 3/1978 | Pacansky | 427/53 |
| 4,470,797 | 9/1984 | Harry et al. | 425/534 |
| 4,483,913 | 11/1984 | Eklund et al. | 430/160 |
| 4,695,286 | 9/1987 | Vanier et al. | 8/471 |
| 4,731,317 | 3/1988 | Fromson et al. | 430/159 |
| 4,775,657 | 10/1988 | Harrison et al. | 503/227 |
| 4,962,081 | 10/1990 | Harrison et al. | 503/227 |
| 4,973,572 | 11/1990 | DeBoer | 503/227 |
| 5,372,907 | 12/1994 | Haley et al. | 430/147 |
| 5,446,477 | 8/1995 | Baek et al. | 346/138 |
| 5,460,918 | 10/1995 | Ali et al. | 430/200 |
| 5,574,493 | 11/1996 | Sanger et al. | 347/262 |

FOREIGN PATENT DOCUMENTS

| | | |
|---|---|---|
| 0562952A1 | 3/1993 | European Pat. Off. . |
| 0 573 091 A1 | 12/1993 | European Pat. Off. . |
| 0 573 092 A1 | 12/1993 | European Pat. Off. . |
| 0 683 728 B1 | 11/1995 | European Pat. Off. . |
| 4442235 | 8/1995 | Germany . |
| 55/105560 | 8/1980 | Japan . |
| 92/09934 | 6/1992 | WIPO . |
| 94/18005 | 8/1994 | WIPO . |

OTHER PUBLICATIONS

Research Disclosure Jan. 1992, #33303, A Lithographic Printing Plate by Vermeersch of Agfa–Gevaert N.V.

*Primary Examiner*—Janet Baxter
*Assistant Examiner*—Sin J. Lee
*Attorney, Agent, or Firm*—Ratner & Prestia

[57] ABSTRACT

A direct write lithographic printing plate comprises a support, a melanaphilic layer, a melanophobic layer with a non-ionic crosslinker and a melanophobic layer with an ionic crosslinker. The plates are long running plates,

21 Claims, 1 Drawing Sheet

DIRECT WRITE LITHOGRAPHIC PRINTING PLATES

CROSS REFERENCE TO RELATED APPLICATIONS

Reference is made to commonly assigned U.S. patent application Ser. No. 08/979,916 filed on Mar. 13, 1997 entitled, “LITHOGRAPHIC PRINTING PLATES WITH SOL-GEL LAYER”, and to commonly assigned U.S. patent application Ser. No. 08/816,287 filed on Mar. 13, 1997, now abandoned entitled, “METHOD OF IMAGING LITHOGRAPHIC PRINTING PLATES WITH HIGH INTENSITY LASER”, both by DeBoer and Fleissig. The disclosure of these related applications is incorporated herein by reference.

FIELD OF THE INVENTION

This invention relates in general to lithographic printing plates and particularly to lithographic printing plates which do not require wet processing.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced; such as paper, cloth and the like. Commonly the ink is transferred to an intennediate material called the blanket which in turn transfers the ink to the surface of the material upon which the image is to be reproduced.

A very widely used type of lithographic printing plate has a light-sensitive coating applied to an aluminum base support. The coating may respond to light by having the portion which is exposed become soluble so that it is removed in the developing process. Such a plate is referred to as positive-working. Conversely, when that portion of the coating which is exposed becomes hardened, the plate is referred to as negative-working. In both instances the image area remaining is ink-receptive or oleophilic and the non-image area or background is water-receptive or hydrophilic. The differentiation between image and non-image areas is made in the exposure process where a film is applied to the plate with a vacuum to insure good contact. The plate is then exposed to a light source, a portion of which is composed of UV radiation. In the instance where a positive plate is used, the area on the film that corresponds to the image on the plate is opaque so that no light will strike the plate, whereas the area on the film that corresponds to the non-image area is clear and permits the transmission of light to the coating which then becomes more soluble and is removed. In the case of a negative plate the converse is true. The area on the film corresponding to the image area is clear while the non-image area is opaque. The coating under the clear area of film is hardened by the action of light while the area not struck by light is removed. The light-hardened surface of a negative plate is therefore oleophilic and will accept ink while the non-image area which has had the coating removed through the action of a developer is desensitized and is therefore hydrophilic.

Direct write photothermal litho plates are known as the Kodak Direct Image Thermal Printing Plate®. However, they require wet processing in alkaline solutions. It would be desirable to have a direct write photothermal litho plate that did not require any processing.

The prior art has tried to produce such plates by a variety of means. All of them fall short of a plate that has high writing sensitivity, high image quality, short roll up, and long run length without any processing.

U.S. Pat. No. 5,372,907 describes a direct write litho plate which is exposed to the laser beam, then heated to crosslink and thereby prevent the development of the exposed areas and to simultaneously render the unexposed areas more developable, and the plate is then developed in conventional alkaline plate developer solution. The problem with this is that developer solutions and the equipment that contains them require maintenance, cleaning, and periodic developer replenishment, all of which are costly and cumbersome.

U.S. Pat. No. 4,034,183 describes a direct write litho plate without development whereby a laser absorbing hydrophilic top layer coated on a support is exposed to a laser beam to burn the absorber to convert it from an ink repelling to an ink receiving state. All of the examples and teachings require a high power laser, and the run lengths of the resulting litho plates are limited.

U.S. Pat. No. 3,832,948 describes both a printing plate with a hydrophilic layer that may be ablated by strong light from a hydrophobic support and also a printing plate with a hydrophobic layer that may be ablated from a hydrophilic support. However, no examples are given.

U.S. Pat. No. 3,964,389 describes a no process printing plate made by laser transfer of material from a carrier film (donor) to a lithographic surface. The problem of this method is that small particles of dust trapped between the two layers may cause image degradation. Also, the necessity of preparing two sheets is more expensive.

U.S. Pat. No. 4,054,094 describes a process for making a litho plate by using a laser beam to etch away a thin top coating of polysilicic acid on a polyester base, thereby rendering the exposed areas receptive to ink. No details of run length or print quality are given, but it is expected that an uncrosslinked polymer such as polysilicic acid will wear off relatively rapidly and give a short run length of acceptable prints.

U.S. Pat. No. 4,081,572 describes a method for preparing a printing master on a substrate by coating the substrate with a hydrophilic polyamic acid and then imagewise converting the polyamic acid to melanophilic polyimide with heat from a flash lamp or a laser. No details of run length, image quality or ink/water balance are given.

U.S. Pat. No. 4,731,317 describes a method for making a litho plate by coating a polymeric diazo resin on a grained anodized aluminum litho support, exposing the image areas with a YAG laser, and then processing the plate with a graphic arts lacquer. The lacquering step is inconvenient and expensive.

Japanese Kokai No. 55/105560 describes a method of preparation of a litho plate by laser beam removal of a hydrophilic layer coated on a melanophilic support, in which the hydrophilic layer contains colloidal silica, colloidal alumina, a carboxylic acid, or a salt of a carboxylic acid. The only examples given use colloidal alumina alone, or zinc acetate alone, with no crosslinkers or addenda. No details are given for the ink/water balance or limiting run length.

WO 92/09934 describes and broadly claims any photosensitive composition containing a photoacid generator, and a polymer with acid labile tetrahydropyranyl groups. This would include a hydrophobic/hydrophilic switching lithographic plate composition. However, such a polymeric switch is known to give weak discrimination between ink and water in the printing process.

EP 0 562 952 A1 describes a printing plate having a polymeric azide coated on a lithographic support, and removal of the polymeric azide by exposure to a laser beam. No printing press examples are given.

WO 94/18005 describes a printing plate having a laser absorbing layer coated on a support with a crosslinked hydrophilic layer which is removed upon exposure to the laser. All the examples teach a polyvinyl alcohol layer crosslinked with hydrolyzed tetraethylorthosilicate.

U.S. Pat. No. 5,460,918 describes a thermal transfer process for preparing a litho plate from a donor with an oxazoline polymer to a silicate surface receiver. A two sheet system such as this is subject to image quality problems from dust and the expense of preparing two sheets.

It would be desirable to be able to prepare a litho plate that has high writing sensitivity, high image quality, short roll up, and long rin length without any processing. None of the prior art examples can do this satisfactorily.

SUMMARY OF THE INVENTION

Figure 1:
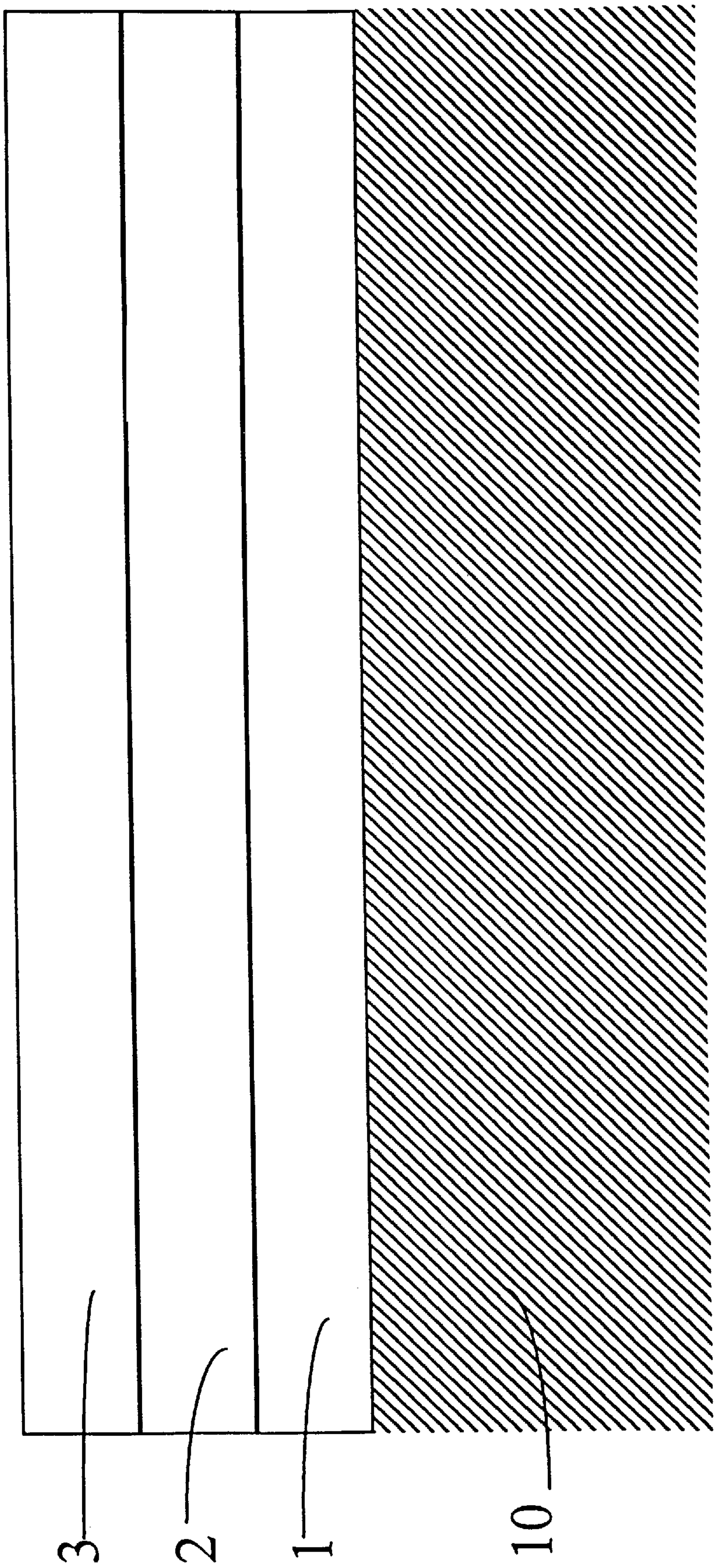
FIG. 1 shows a lithographic printing plate of the invention.

The present invention is a lithographic printing plate in which a support web is coated with an ink accepting laser absorbing layer which is subsequently overcoated with a crosslinked hydrophilic layer having metal oxide groups, wherein the improvement lies in the addition of an additional overcoat having a crosslinked hydrophilic layer having metal oxide groups where the crosslinking agent contains ionic groups. Exposure of this plate to a high intensity laser beam followed by mounting on a press results in excellent impressions without chemical processing.

The lithographic printing plate comprises:

a) a support web with b) a coextensive melanophilic photothermal conversion layer with c) a coextensive melanophobic layer comprising a crosslinked polymeric matrix containing a member of the group consisting of colloids of beryllium, magnesium, aluminum, silicon, gadolinium, germanium, arsenic, indium, tin, antimony, tellurium, lead, bismuth and the transition metal oxides and d) an additional coextensive melanophobic layer comprising a crosslinked polymeric matrix containing a member of the group consisting of colloids of beryllium, magnesium, aluminum, silicon, gadolinium, germanium, arsenic, indium, tin, antimony, tellurium, lead, bismuth and the transition metal oxides, where the crosslinking agent contains ionic groups.

DETAILED DESCRIPTION OF THE INVENTION

The support for this invention can be a polymer, metal or paper foil, or a lamination of any of the three. The thickness of the support can be varied, as long as it is sufficient to sustain the wear of the printing press and thin enough to wrap around the printing form. A preferred embodiment uses polyethylene terephthalate in a thickness from 100 to 200 microns. Another preferred embodiment uses aluminum from 100 to 500 microns in thickness. The support should resist stretching so the color printing records will register in a full color image. The support may be coated with one or more "subbing" layers to improve adhesion of the final assemblage. The back side of the support may be coated with antistat agents and/or slipping layers or matte layers to improve handling and "feel" of the litho plate.

The term "melanophilic" is Greek for ink-loving. Since most conventional printing inks are linseed oil based, melanophilic will usually coincide with oleophilic.

The photothermal conversion layer absorbs laser radiation and converts it into heat. It converts photons into phonons. To do this it must contain a non-luminescent absorber. Such an absorber may be a dye, a pigment, a metal, or a dichroic stack of materials that absorb by virtue of their refractive index and thickness. The absorber may be in the hydrophilic layer or thermally close to the hydrophilic layer. By this it is implied that a significant portion of the heat generated by the absorber acts to raise the temperature of the hydrophilic layer to a level where switching to the melanophilic state occurs. Examples of dyes useful as absorbers for near infrared diode laser beams may be found in U.S. Pat. No. 4,973,572, hereby incorporated by reference. A useful example of a pigment is carbon.

The binder used to hold the dye or pigment in the photothennal conversion layer may be chosen from a large list of film forming polymers. Useful polymers may be found in the families of polycarbonates, polyesters, and polyacrylates. Chemically modified cellulose derivatives are particularly useful, such as nitrocellulose, cellulose acetate propionate, and cellulose acetate.

Exemplary polymers may be found in U.S. Pat. Nos. 4,695,286; 4,470,797; 4,775,657; and 4,962,081, hereby incorporated by reference.

Surfactants may be included in the photothermal conversion layer to facilitate coating uniformity. A particularly useful surfactant for solvent coated polymer layers is DC510, a silicone oil sold by the Dow Corning Company of Midland, Mich.

The melanophobic or hydrophilic layer is intended to be wet effectively by the aqueous fountain solution in the lithographic printing process, and when wet, to repel the ink. In addition it is useful if the hydrophilic layer is somewhat porous, so that wetting is even more effective. The hydrophilic layer must be crosslinked if long printing run lengths are to be achieved, because an uncrosslinked layer will wear away too quickly. Many crosslinked hydrophilic layers are available. Crosslinking agents which are non-ionic are generally dialkoxy or trialkoxy silanes. They have only covalent bonds and more preferably trialkoxysilanes that have only covalent bonds. Any alkyl or substituted alkyl trialkoxy silane where the substituted alkyl groups contain only covalent bonds are particularly preferred. Those derived from di, tri, or tetra alkoxy silanes or titanates, zirconates and aluminates are particularly useful in this invention. Examples of non-ionic crosslinkers useful herein include:

3-aminopropyltriethoxy silane
3-aminopropyltrimethoxy silane
N-2-aminoethyl-3-aminopropyltriethoxysilane
N-2-aminoethyl-3-aminopropyltrimethoxysilane
3-glcidoxypropyltriethoxysilane
3-glycidoxypropyltrimethoxysilane
3-mercaptopropyltriethoxysilane
3-mercaptopropyltrimethoxysilane propyl triethoxysilane
propyl trimethoxysilane
3-chloropropyl triethoxysilane
3-chloropropyl trimethoxysilane
N-[3-(triethoxysilyl)-propyl]-4,5-dihydroimidazole
N-[3-(trimethoxysilyl)-propyl]-4,5-dihydroimidazole
triethoxysilylpropyldiethylenetriamine and
trimethoxysilylpropyldiethylenetri amine Examples are colloids of hydroxysilicon, hydroxyaluminum, hydroxytitanium and hydroxyzirconium. These colloids are formed by methods fully described in U.S. Pat. Nos. 2,244,325; 2,574,902; and 2,597,872. Stable dispersions of such colloids can be conveniently purchased from companies such as the DuPont Company of Wilmington, Del. It is important that the hydrophilic layer have a strong affinity for water. If the hydrophilic layer does not hold enough water, the background areas may carry some ink, commonly referred to as "scumming" of the lithoplate. To compensate for this problem, the press operator may have to increase the amount of fountain solution fed to the printing form, and this, in turn, may lead to emulsification of the ink with the fountain solution, resulting in a mottled appearance in solid dark areas. The severity of the problem will depend on the actual ink and fountain solution as well as the press that is being used, but, in general, the more affinity the background of the plate has for water, the less printing problems will be. In this invention, it has been found that an overcoat of metal colloids crosslinked with a crosslinker containing ionic groups helps to hold water and improves the printing performance. In a preferred embodiment of the invention the metal colloid is colloidal silica and the crosslinker is N-trimethoxysiliylpropyl-N,N,N-trimethyl ammonium chloride. For the same reason, the hydrophilic layer is most effective when it contains a minimum amount of hydrophobic groups such as methyl or alkyl groups. The thickness of the crosslinking and polymer forming layer may be from 0.05 to 1 micron in thickness, and most preferably from 0.1 to 0.3 microns in thickness. The amount of silica added to the layer may be from 100 to 5000% of the crosslinking layer, and most preferably from 500% to 1500% of the crosslinking layer. Surfactants, dyes, laser absorbers, colorants useful in visualizing the written image, and other addenda may be added to the hydrophilic layer, as long as their level is low enough that there is no significant interference with the ability of the layer to hold water and repel ink.

When the ionic crosslinker N-timethoxysilylpropyl-N,N,N-trimethyl ammonium chloride with silica is used alone over the melanophilic photothennal conversion layer, excellent printing impressions are produced on the printing press, but the run length is relatively short, and the inked areas begin to grow into the background after about a thousand impressions. This problem is overcome, as shown in FIG. 1, by the addition of an intenrediate layer 2, which is crosslinked by a non-ionic crosslinking agent such as aminopropyltriethoxysilane. FIG. 1 also shows the support web 10, the photothermal conversion layer 1, and the melanophobic top coat 3. As example 2 shows, several thousand impressions can be printed without image area growth problems.

The topmost layer 3 comprises an additional coextensive melanophobic layer comprising a crosslinked polymeric matrix containing a member of the group consisting of colloids of beryllium, magnesium, aluminum, silicon, gadolinium, gennanium, arsenic, indium, tin, antimony, tellurium, lead, bismuth and the transition metal oxides and a crosslinker where the crosslinking agent contains ionic groups. This layer differs from layer 2 in that the combination of two overcoat layers achieves both good run length and roll-up at the same time. The crosslinking agent contains an ionic group such as a tetra alkyl ammonium or a sulfonic acid salt. In addition, it should be understood that both or either of the top layers can contain surfactants, dyes, laser absorbers, colorants useful in visualizing the written image, plasticizers, and other addenda, as long as their level is low enough that there is no significant interference with the ability of the layer to hold water and repel ink. Ionic crosslinkers useful in the topmost melanophilic layer are preferably dialkoxy or more preferably trialkoxy silane that has one or more ionic bonds. Most preferred are alkyl or substituted alkyl trialkoxy silane, where the substituted alkyl group has an ionic group such as a quaternary amine group or a sulfonic acid group. Examples of those materials include:

N-trimethoxysilyl propyl-N,N,N-trimethylammonium chloride;

trimethoxysilypropylisothiouronium chloride;

3-(trimethoxysilyl)-1-propane sulfonic acid, sodium salt;

3-trimethoxysilylpropionic acid, sodium salt;

N-(3-trimethoxysilylpropyl)-N-methyl-N,N-diallylammonium chloride;

2-(trimethoxysilyl)ethyl-2-N-methylpyridinium chloride; and 3-(N-strylmethyl-2-aminoethylamino)-propyltrimethoxysilane hydrochloride.

The range of crosslinker present in either the first melanophobic layer or second melanophobic layer can be from 1 to 50 parts per 100 parts of colloid. More preferred is from 1 to 10 parts per 100 parts of colloid.

Preferably the first melanophobic layer contains less than 5% hydrocarbon groups by weight.

The laser used to expose the lithoplate of this invention is preferably a diode laser, because of the reliability and low maintenance of diode laser systems, but other lasers such as gas or solid state lasers may also be used.

The layers are coated onto the support by any of the commonly known coating methods such as spin coating, knife coating, gravure coating, dip coating, or extrusion hopper coating. The process for using the resulting lithographic plate comprises the steps of 1) exposing the plate to a focused laser beam in the areas where ink is desired in the printing image, and 2) employing the plate on a printing press. No heating, processing, or cleaning is needed before the printing operation. A vacuum cleaning dust collector may be useful during the laser exposure step to keep the focusing lens clean. Such a collector is fully described in U.S. Pat. No. 5,574,493. The power, intensity and exposure level of the laser is fully described in the above cross referenced co-pending application.

The following examples illustrate the practice of the invention.

COMPARATIVE EXAMPLE 1

A mixture of 24 g of high viscosity nitrocellulose, 24 g of carbon black, 536 g of methylisobutyl ketone and 964 g cyclopentanone was tumnbled with beads of zirconium oxide until the mixture was smooth and uniform. The zirconium beads were removed and the black dispersion was coated onto a web of 125 micron thick polyethyleneterphthalate. The web laydown of the coating was 33 cc per square meter. When dry, the web was overcoated with a mixture of 30 g of Nalco 2326 (5 nm colloidal silica, stabilized with ammonia), 70 g of water, 0.05 g of Zonyl FSN (a surfactant sold by the DuPont Company of Wilmington, Del.), and 0.5 g of N-trimethyloxysilyl-propyl-N,N,N-trimethyl ammonium chloride. The wet laydown of the coating was 14 cc per square meter. During the drying process, the coating was held at 118° C. for 3 minutes. The coating was then exposed to a focused diode laser beam at 830 nm wavelength on an apparatus similar to that described in U.S. Pat. No. 5,446,477. The exposure level was about 600 mJ/square cm, and the intensity of the beam was about 3 m W/square micron. The laser beam was modulated to produce a halftone dot image. After exposure the plate was mounted on an ABDick press and 2000 excellent impressions were made without wear. When the $2500^{th}$ impression was pulled, however, severe wear and image growth was seen at the image edges.

EXAMPLE 1

Another portion of the black nitrocellulose undercoating was overcoated, this time with a mixture of 30 g of Nalco 2326, 70 g of water, 0.05 g of Zonyl FSN, and 0.5 g of aminopropyltriethoxysilane. When dry, the coating was then overcoated with the same silica layer as used in Comparative Example 1. The coating was exposed as in Comparative Example 1, and printed on the same press that was used in Comparative Example 1. In this case, 4000 impressions were made without any sign of wear or image growth.

COMPARATIVE EXAMPLE 2

Another plate was prepared, exactly as in Comparative Example 1, except the crosslinker used was aminopropyltriethoxysilane. The plate of this example was mounted on the ABDick press along side of the plate of Example 1. The printing operation was started, and after about 100 impressions, the dampening solution was turned off. After about 10 impressions without dampening solution, the entire image on both plates was black with ink. The dampening solution was then turned back on, and impressions continued to print. After about 30 impressions, the background of the plate of Example 1 had completely cleared and high quality impressions were again produced. The plate of Comparative Example 2, on the other hand, still had blocked in shadows after 100 impressions. In Comparative Example 1, the crosslinker is the ionic quaternary ammonium salt, and this results in a limited run length. In Comparative Example 1 both crosslinked layers are used. The ionic quarternary crosslinker on top and the non-ionic amino crossliiker underneath for long press performance and roll up and wear and run length. Comparative Example 2 compares the roll up of non-ionic crosslinked silica with and without the ionically crosslinked overcoat. A diagram of the results are shown below:

| | Comparative Example 1 | Example 1 | Comparative Example 2 |
|---|---|---|---|
| | Quarternary Crosslinker Carbon + Nitrocellulose Estar | Quarternary Cross-linker (ionic) Amino Crosslinker (non-ionc) Carbon + Nitrocellulose Estar | Amino Crosslinker Carbon + Nitrocellulose Estar |
| Results | Short Run Length | Fast Roll up; long run length | Slow roll up |

This shows the superior water carrying ability of the ionically crosslinked top coat.

The invention has been described in detail, with particular reference to certain preferred embodiments thereof, but it should be understood that variations and modifications can be effected within the spirit and scope of the invention.

We claim:

1. A lithographic printing plate comprising:

a) a support web, b) a coextensive melanophilic photothermal conversion layer coated on said web and c) a coextensive melanophobic layer comprising a crosslinked polymeric matrix containing a colloid of (1) an oxide of a metal selected from the group consisting of beryllium, magnesium, aluminum, silicon, gadolinium, arsenic, indium, tin, antimony, tellurium, lead, bismuth, and transition metals;

(2) hydroxytitanium;

(3) hydroxyaluminum; or (4) hydroxyzirconium;

said layer also comprising a non-ionic crosslinker and d) an additional coextensive melanophobic layer comprising a crosslinked polymeric matrix containing a colloid of (1) an oxide of a metal selected from the group consisting of beryllium, magnesium, aluminum, silicon, gadolinium, arsenic, indium, tin, antimony, tellurium, lead, bismuth, and transition metals;

(2) hydroxytitanium;

(3) hydroxyaluminum; or (4) hydroxyzirconium;

said layer also comprising a crosslinker where the crosslinking agent contains ionic groups.

2. The printing plate of claim 1 wherein said support is a polyester film.

3. The printing plate of claim 1 wherein the support is anodized aluminum.

4. The printing plate of claim 1 wherein the photothennal conversion layer comprises carbon dispersed in a cellulosic binder.

5. The printing plate of claim 1 wherein the melanophobic layer (c) comprises carbon dispersed in nitrocellulose.

6. The printing plate of claim 1 wherein the thickness of the melanophobic layer (c) is from 0.05 to 1 micron.

7. The printing plate of claim 6 wherein the thickness of the melanophobic layer (c) is from 0.1 to 0.3 micron.

8. The printing plate of claim 1 wherein the melanophobic layer (c) contains less than 5% hydrocarbon groups by weight of the melanophobic layer (c).

9. The printing plate of claim 1 wherein the non-ionic crosslinker is a di or tri alkoxy silane that has only covalent groups.

10. The printing plate of claim 9 wherein the non-ionic crosslinker is a trialkoxysilane.

11. The printing plate of claim 9 wherein the non-ionic crosslinker is a substituted alkyl trialkoxy silane when the substituted alkyl group has only covalent bonds.

12. The printing plate of claim 9 wherein the non-ionic crosslinker is selected from the group consisting of:

3-aminopropyltriethoxy silane 3-aminopropyltrimethoxy silane

N-2-aminoethyl-3-aminopropyltriethoxysilane

N-2-aminoethyl-3-aminopropyltrimethoxysilane 3-glycidoxypropyltrimethoxysilane 3-grlycidoxypropyltrimethoxysilane 3-mercaptopropyltriethoxysilane 3-mercaptopropyltrimethoxysilane propyl triethoxysilane propyl trimethoxysilane 3-chloropropyl triethoxysilane 3-chloropropyl trimethoxysilane N-[3-(triethoxysilyl)-propyl]-4,5-dihydroimidazole N-[3-(trimethoxysilyl)-propyl]-4,5-dihydroimidazole triethoxysilylpropyldiethylenetriamine and trimethoxysilylpropyldiethylenetriamine.

13. The printing plate of claim 1 wherein the ionic crosslinker is dialkoxy or trialkoxy silane that has one or more ionic bonds.

14. The printing plate of claim 13 wherein the crosslinker is a trialkoxysilane having one or more ionic bonds.

15. The printing plate of claim 13 wherein the crosslinker is a substituted alkyl aloxy silane wherein the substituted alkyl has an ionic group.

16. The printing plate of claim 13 wherein the ionic crosslinker is selected from the group consisting of:

N-trimethoxysilyl propyl-N,N,N-trimethylammonium chloride;

trimethoxysilypropylisothiouronium chloride;

3-(trimethoxysilyl)-1-propane sulfonic acid, sodium salt;

3-trimethoxysilylpropionic acid, sodium salt;

N-(3-trimethoxysilylpropyl)-N-methyl-N,N-diallylammonium chloride;

2-(trimethoxysilyl)ethyl-2-N-methylpyridinium chloride; and 3-(N-strylmethyl-2-aminoethylamino)-propyltrimethoxysilane hydrochloride.

17. The printing plate of claim 1 wherein the colloid in both melanophobic layers is hydroxytitanium.

18. The printing plate of claim 1 wherein the colloid in layer c) is hydroxyaluminum.

19. The printing plate of claim 1 wherein the colloid in layer c) is hydroxyltitanium.

20. The printing plate of claim 1 wherein the colloid in layer c) is hydroxyzirconium.

21. The printing plate of claim 1 wherein the colloid in both melanophobic layers is silica.

* * * * *